(12) United States Patent
Yamada et al.

(10) Patent No.: US 7,901,842 B2
(45) Date of Patent: Mar. 8, 2011

(54) PHOTOMASK BLANK AND METHOD OF PRODUCING THE SAME, METHOD OF PRODUCING PHOTOMASK, AND METHOD OF PRODUCING SEMICONDUCTOR DEVICE

(75) Inventors: Takeyuki Yamada, Tokyo (JP); Yasushi Okubo, Tokyo (JP); Masao Ushida, Tokyo (JP); Hiroyuki Iwashita, Tokyo (JP)

(73) Assignee: Hoya Corporation, Tokyo (JP)

( * ) Notice: Subject to any disclaimer, the term of this patent is extended or adjusted under 35 U.S.C. 154(b) by 239 days.

(21) Appl. No.: 12/088,408

(22) PCT Filed: Sep. 29, 2006

(86) PCT No.: PCT/JP2006/319491
§ 371 (c)(1),
(2), (4) Date: Jul. 30, 2008

(87) PCT Pub. No.: WO2007/037383
PCT Pub. Date: Apr. 5, 2007

(65) Prior Publication Data
US 2009/0233182 A1 Sep. 17, 2009

(30) Foreign Application Priority Data
Sep. 30, 2005 (JP) .............................. 2005-286236

(51) Int. Cl.
*G03F 1/00* (2006.01)
(52) U.S. Cl. ............................ 430/5; 430/311; 430/394
(58) Field of Classification Search .................... 430/5, 430/311, 394; 438/710, 717; 716/19
See application file for complete search history.

(56) References Cited

U.S. PATENT DOCUMENTS

| 2005/0100797 A1 | 5/2005 | Shoki et al. |
| 2005/0221199 A1* | 10/2005 | Sandstrom ...................... 430/5 |
| 2005/0238922 A1* | 10/2005 | Kinoshita et al. ........... 428/698 |
| 2005/0260505 A1* | 11/2005 | Fukushima et al. ............ 430/5 |

FOREIGN PATENT DOCUMENTS

| JP | 62-32782 B2 | 9/1982 |
| JP | 2983020 B1 | 11/1999 |
| JP | 3276954 B2 | 2/2000 |
| JP | 2004-104118 A | 4/2004 |

* cited by examiner

*Primary Examiner*—Mark F Huff
*Assistant Examiner*—Rashid Alam
(74) *Attorney, Agent, or Firm*—Sughrue Mion, PLLC

(57) ABSTRACT

It is provided a photomask blank that has good flatness when a light-shielding film is patterned and hence can provide a good mask pattern accuracy and a good pattern transfer accuracy, and a method of producing a photomask.

A photomask blank of the present invention includes a light-shielding film containing at least chromium on a light-transmitting substrate. The light-shielding film is formed so as to cause a desired film stress in the direction opposite to that of a change in the film stress that is anticipated to be caused in the light-shielding film by heat treatment according to a resist film formed on the light-shielding film. A photomask is produced by patterning the light-shielding film of the photomask blank by dry etching.

25 Claims, 5 Drawing Sheets

US 7,901,842 B2

PHOTOMASK BLANK AND METHOD OF PRODUCING THE SAME, METHOD OF PRODUCING PHOTOMASK, AND METHOD OF PRODUCING SEMICONDUCTOR DEVICE

CROSS REFERENCE TO RELATED APPLICATIONS

This application is a National Stage of International Application No. PCT/JP2006/319491 filed on Sep. 29, 2006, claiming priority based on Japanese Patent Application No. 2005-286236, filed Sep. 30, 2005, the contents of all of which are incorporated herein by reference in their entirety.

TECHNICAL FIELD

The present invention relates to methods for producing a photomask blank and a photomask, in which the dry etching rate of a light-shielding film is optimized for forming a light-shielding film pattern by dry etching. The present invention further relates to a method for producing a semiconductor device.

BACKGROUND ART

In general, in a process for producing a semiconductor device, a micro pattern is formed by photolithography. Furthermore, the forming of this micro pattern usually uses several substrates called photomasks. In general, these photomasks are each made of a light-shielding metal thin film or the like having a micro pattern on a light-transmitting glass substrate, and photolithography is also used in the production of these photomasks.

The production of a photomask by photolithography uses a photomask blank having a light-shielding film on a light-transmitting substrate such as a glass substrate. This method of forming a photomask by using a photomask blank includes an exposure process of subjecting a resist film formed on the photomask blank to predetermined patterning exposure, a development process of forming a resist pattern by developing the resist film according to the predetermined patterning exposure, an etching process of etching the light-shielding film along the resist pattern, and a process of removing the remaining resist pattern. In the development process, the resist pattern is formed by subjecting the resist film formed on the photomask blank to predetermined patterning exposure and then supplying a developing solution for dissolving the resist film portion, which is soluble to the developing solution. In addition, in the etching process, a desired mask pattern is formed on the light-transmitting substrate by using the resist pattern as a mask, and dissolving the exposing portion of the light-shielding film where the resist pattern is not formed by, for example, wet etching. Thus, a photomask is formed.

Patent Document 1 describes a photomask blank as a mask blank suitable for wet etching. The photomask blank includes a transparent substrate having a light-shielding film of a chromium film containing chromium carbide thereon. Similarly, Patent Document 2 describes a half-tone phase-shift mask blank as a mask blank suitable for wet etching. The half-tone phase-shift mask blank includes a lamination film of a half-tone material layer and a metal layer on a transparent substrate. This metal layer includes a region constituted with different materials so that the etching grade varies from the surface side toward the transparent substrate side. For example, a lamination film composed of a metal layer of CrN/CrC and a reflection-preventing layer of CrON is described.

In a case of a chromium light-shielding film as described in Patent Documents 1 and 2, it is known that crystalline granules pull to each other when the film is formed, and thereby a film stress occurs in the tensile direction. It is also known that the problem of occurrence of a film stress is significant particularly in a case of a chromium carbide film containing carbon in chromium or a chromium oxide film containing oxygen in chromium. In a photomask blank including a light-shielding film thus having a film stress, a warp occurs in the substrate. If a photomask is formed using this photomask blank having low flatness due to this warp of the substrate, a designed patterning accuracy cannot be achieved. If the pattern is transferred onto a semiconductor substrate (silicon wafer) using such a photomask, a designed pattern is not precisely formed on the semiconductor substrate to cause bad operation. This problem has been aggravated with recent miniaturization of a pattern.

Therefore, a chromium light-shielding film having a film stress of sufficiently near zero (0) is ideal. For example, Patent Document 3 proposes a reduction in the film stress of a chromium light-shielding film.

That is, Patent Document 3 describes a method of producing a photomask blank provided with a light-shielding film having a low film stress by introducing helium into an atmospheric gas during the formation of the film.

Patent Document 1: Japanese Patent Publication (JP-B) No. 62-32782
Patent Document 2: Japanese Patent (JP-B) No. 2983020
Patent Document 3: Japanese Patent (JP-B) No. 3276954

DISCLOSURE OF INVENTION

Problems to be Solved by the Invention

However, the investigation by the present inventors has revealed the fact that a stress occurs in the tensile direction by heating a chromium light-shielding film. When a photomask is produced by using a photomask blank having a light-shielding film formed on a substrate, a resist film that is formed on the light-shielding film is baked (heat treatment) for improving the adhesion of the resist film. Accordingly, for example, the subsequent bake treatment further causes a stress in the tensile direction of a chromium light-shielding film, even if the film stress in the tensile direction of the chromium light-shielding film is reduced to a level as low as possible by using the method described in the aforementioned Patent Document 3. As a result, a problem that a photomask blank with good flatness cannot be obtained is not solved.

Accordingly, the present invention has been made for solving these problems, and it is an object of the present invention to provide a photomask blank that has good flatness when a light-shielding film is patterned and thereby can provide a high mask patterning accuracy and a high pattern-transferring accuracy and to provide a method of producing the same, a method of producing a photomask, and a method of producing a semiconductor device.

Means for Solving the Problems

In order to solve the above-mentioned problems, the present invention has the following aspects.

(Aspect 1)
A photomask blank comprising a light-shielding film containing at least chromium on a light-transmitting substrate, wherein the light-shielding film is formed so as to cause a desired film stress in the direction opposite to that of a change in the film stress that is anticipated to be caused in the light-shielding film by heat treatment according to a resist film formed on the light-shielding film.

(Aspect 2).

The photomask blank according to the aspect 1, wherein the desired film stress is achieved by controlling the nitrogen content in the light-shielding film.

(Aspect 3)

A method of producing a photomask blank comprising a process forming a light-shielding film containing chromium and nitrogen on a light-transmitting substrate by sputtering using a target composed of chromium in atmosphere containing nitrogen, wherein the nitrogen content contained in the light-shielding film is adjusted to cancel a change in the film stress that is caused by heat treatment applied to the light-shielding film.

(Aspect 4)

A method of producing a photomask blank comprising a process forming a light-shielding film containing chromium and nitrogen on a light-transmitting substrate by sputtering using a target composed of chromium in atmosphere containing nitrogen, wherein the nitrogen content contained in the light-shielding film is adjusted so that the light-shielding film has a desired film stress in the direction opposite to that of a change in the film stress that is caused by heat treatment applied to the light-shielding film after the formation of the light-shielding film and thereby the flatness of the photomask blank is a predetermined level or less.

(Aspect 5)

The method of producing a photomask blank according to the aspect 3 or 4, wherein the heat treatment is performed before the formation of a resist film or after the formation of a resist film on the light-shielding film.

(Aspect 6)

The method of producing a photomask blank according to any one of aspects 3 to 5, wherein a difference in flatness between that of the substrate before the formation of the light-shielding film and that of the substrate after the formation of the light-shielding film and then heat treated is 0.10 μm or less.

(Aspect 7)

The method of producing a photomask blank according to any one of aspects 3 to 6, wherein the nitrogen content is adjusted so that the light-shielding film has a compression stress.

The method of producing a photomask blank according to any one of aspects 3 to 7, wherein a half-tone phase-shifter film is formed between the light-transmitting substrate and the light-shielding film.

(Aspect 9)

The method of producing a photomask blank according to any one of aspects 3 to 8, wherein the half-tone phase-shifter film has a transmittance of 10% or more and 40% or less at an exposure wavelength.

(Aspect 10)

The method of producing a photomask blank according to aspect 8 or 9, wherein the light-shielding film has a thickness so that an optical density of 2.5 or more is achieved in a combination with the half-tone phase-shifter film.

(Aspect 11)

The method of producing a photomask blank according to any one of aspects 3 to 10, wherein the photomask blank is one for dry etching being provided for a method of producing a photomask by patterning the light-shielding film by dry etching using a resist pattern formed on the light-shielding film as a mask.

(Aspect 12)

A method of producing a photomask comprising a process of patterning the light-shielding film of a photomask blank obtained by the method according to any one of aspects 3 to 11 by dry etching.

(Aspect 13)

A method of producing a photomask wherein the light-shielding film of a photomask blank obtained by the method according to any one of aspects 8 to 10 is patterned by dry etching to form a light-shielding film pattern on the half-tone phase-shifter film, and then the half-tone phase-shifter film is patterned by dry etching using the light-shielding film pattern as a mask to form a half-tone phase-shifter film pattern on the light-transmitting substrate.

(Aspect 14)

A method of producing a photomask blank comprising a process of forming a light-shielding film containing chromium and nitrogen on a light-transmitting substrate by sputtering using a target of chromium or having a main component of chromium in atmosphere containing a helium gas and at least one of a nitrogen gas and a nitrogen compound gas, wherein the flow rate of at least one of the nitrogen gas, the nitrogen compound gas, and the helium gas contained in the sputtering atmosphere is adjusted so that the light-shielding film has a desired film stress in the direction opposite to that of a change in the film stress that is caused by heat treatment applied to the light-shielding film after the formation of the light-shielding film and thereby the flatness of the photomask blank is a predetermined level or less.

(Aspect 15)

The method of producing a photomask blank according to aspect 14, wherein the heat treatment is performed before the formation of a resist film or after the formation of a resist film on the light-shielding film.

(Aspect 16)

The method of producing a photomask blank according to aspect 14 or 15, wherein the gas flow rate of at least one of the nitrogen gas, the nitrogen compound gas, and the helium gas is adjusted so that the light-shielding film has a compression stress.

(Aspect 17)

The method of producing a photomask blank according to any one of aspects 14 to 16, wherein the gas flow rate of at least one of the nitrogen gas, the nitrogen compound gas, and the helium gas is adjusted so that the selection ratio of the light-shielding film to a resist formed on the light-shielding film exceeds 1.

(Aspect 18)

The method of producing a photomask blank according to any one of aspects 14 to 17, wherein a half-tone phase-shifter film is formed between the light-transmitting substrate and the light-shielding film.

(Aspect 19)

The method of producing a photomask blank according to any one of aspects 14 to 18, wherein the half-tone phase-shifter film has a transmittance of 10% or more and 40% or less to at an exposure wavelength.

(Aspect 20)

The method of producing a photomask blank according to aspect 18 or 19, wherein the light-shielding film has a thickness so that an optical density of 2.5 or more is achieved in a combination with the half-tone phase-shifter film.

(Aspect 21)

The method of producing a photomask blank according to any one of aspects 14 to 20, wherein the photomask blank is one for dry etching being provided for a method of producing a photomask by patterning the light-shielding film by dry etching using a resist pattern formed on the light-shielding film as a mask.

(Aspect 22)

A method of producing a photomask comprising a process of patterning the light-shielding film of a photomask blank obtained by the method according to any one of aspects 14 to 21 by dry etching.

(Aspect 23)

A method of producing a photomask wherein the light-shielding film of a photomask blank obtained by the method according to any one of aspects 18 to 20 is patterned by dry etching to form a light-shielding film pattern on the half-tone phase-shifter film, and then the half-tone phase-shifter film is patterned by dry etching using the light-shielding film pattern as a mask to form a half-tone phase-shifter film pattern on the light-transmitting substrate.

(Aspect 24)

A method of producing a semiconductor device, wherein a pattern is transferred onto a semiconductor substrate by photolithography using the light-shielding film pattern or the half-tone phase-shifter film pattern of the photomask according to any one of aspects 12, 13, 22, and 23.

As in the aspect 1, the photomask blank according to the present invention comprises a light-shielding film containing at least chromium on a light-transmitting substrate, and the light-shielding film is formed so as to cause a desired film stress in the direction opposite to that of a change in the film stress that is anticipated to be caused in the light-shielding film by heat treatment according to a resist film formed on the light-shielding film.

Thus, the light-shielding film is formed so as to cause a desired film stress in the direction opposite to that of a change in the film stress that is anticipated to be caused in the light-shielding film by heat treatment. Therefore, the film stress of the light-shielding film can be substantially canceled by the change in the film stress that is caused by the subsequent heat treatment. As a result, it is provided a photomask blank having good flatness when the light-shielding film is patterned by heat treatment according to a resist film that is formed on the light-shielding film, even if a chromium light-shielding film is formed. That is, in the photomask blank according to the present invention, substantially no film stress is generated in the light-shielding film at the point when a resist film has been formed on the light-shielding film and necessary heat treatment has been conducted, and hence the photomask blank can have good flatness. Consequently, the subsequent patterning of the light-shielding film can be performed at a good mask patterning accuracy.

The heat treatment according to the resist film is bake treatment of the resist film that is formed on the light-shielding film. When a photomask is produced using a photomask blank, bake treatment is generally conducted before and after the forming of the resist film on the light-shielding film or after the forming of the resist film. The heating conditions for the bake treatment are determined depending on the type of resist, and the bake treatment is conducted at a high temperature of approximately 120° C. or more. With the heat treatment at such a high temperature, a change in the stress of the chromium light-shielding film is caused, and thereby the flatness of the substrate having the light-shielding film is highly deteriorated. Therefore, the present invention is preferred.

As in the aspect 2, the film stress of the light-shielding film can be adjusted to a desired film stress by controlling the nitrogen content in the light-shielding film. That is, in a case of a light-shielding film containing chromium, a change in the film stress generally occurs in the tensile direction by heat treatment. Therefore, the film stress of the light-shielding film when the film is formed is adjusted so that a desired film stress in the compression direction, which is opposite to the aforementioned change, is previously imparted to the light-shielding film, by controlling the nitrogen content in the light-shielding film. In general, it is preferable that the nitrogen content be controlled in consideration of a change in the film stress that will be caused by heat treatment at the highest temperature in conditions for heat treatment (bake treatment) after the formation of the light-shielding film.

As in the aspect 3, the method of producing the photomask blank according to the present invention comprises a process forming a light-shielding film containing chromium and nitrogen on a light-transmitting substrate by sputtering using a target composed of chromium in atmosphere containing nitrogen. The method is characterized in that the nitrogen content contained in the light-shielding film is adjusted to cancel a change in the film stress that is caused by heat treatment applied to the light-shielding film.

As in the aspect 4, the method of producing the photomask blank according to the present invention comprises a process forming a light-shielding film containing chromium and nitrogen on a light-transmitting substrate by sputtering using a target composed of chromium in atmosphere containing nitrogen. The method is characterized in that the nitrogen content contained in the light-shielding film is adjusted so that the light-shielding film has a desired film stress in the direction opposite to that of a change in the film stress that is caused by heat treatment applied to the light-shielding film after the formation of the light-shielding film and thereby the flatness of the photomask blank is a predetermined level or less.

With this, substantially no film stress is generated in the light-shielding film at the point when a resist film has been formed on the light-shielding film and necessary heat treatment has been conducted. Consequently, a photomask blank with good flatness can be obtained.

Furthermore, as in the aspect 5, the heat treatment of the light-shielding film is conducted before the formation of the resist film on the light-shielding film or after the formation of the resist film. In general, in a photomask blank-producing process, the heat treatment that is conducted at a high temperature after the formation of the light-shielding film is bake treatment that is conducted before the formation of a resist film for improving adhesion or prebake treatment that is conducted after the formation of a resist film. Since the aforementioned heat treatment causes a large change in the film stress of the light-shielding film, the nitrogen content contained in the light-shielding film is preferably adjusted according to the heat treatment.

Concretely, as in the aspect 6, the photomask blank according to the present invention it is desirable that a difference in flatness between that of the substrate before the formation of the light-shielding film and that of the substrate after the formation of the light-shielding film and then heat treated is 0.10 µm or less.

With this, the flatness variation of the substrate (substrate having the light-shielding film) after the heat treatment (bake treatment) to the flatness of the substrate before the formation of the light-shielding film is a very small of 0.10 µm or less. Accordingly, a photomask blank or a photomask that can provide good flatness when the light-shielding film is patterned can be obtained. In a photomask having good flatness, a change in the flatness of the photomask is suppressed when the photomask is set to a mask holder of an exposure device for transferring a pattern to a resist film formed on a semiconductor substrate and is held with a vacuum chuck. Consequently, the position accuracy of the pattern transfer is preferably improved.

Furthermore, as in the aspect 7, in a light-shielding film containing chromium, a stress is generated in the direction of a tensile stress by heat treatment. Accordingly, it is preferable that the nitrogen content be previously adjusted so that the film has a compression stress.

Furthermore, as in the aspect 8, a half-tone phase-shifter film may be formed between a light-transmitting substrate and a light-shielding film. A half-tone phase-shift mask having such a half-tone phase-shifter film can particularly improve the resolution and is thus remarkably suitable for forming a micro mask pattern. In such a case, as in the aspect 9, when the half-tone phase-shifter film has a transmittance of 10% or more and 40% or less to exposure light, the present invention is particularly suitable. That is, in a half-tone phase-shift mask having a phase-shifter film with a high transmittance to exposure light, a portion that is fundamentally required to be completely shielded from light is more completely shielded from light by a structure in which a light-shielding film is disposed at a portion that is in a region where a mask pattern of the phase-shifter film is formed and is other than the boundary with a light-transmitting portion (portion where a mask pattern is not formed and a light-transmitting substrate is exposed) of the mask pattern. Therefore, superiority and inferiority of the flatness of the photomask blank highly affect the patterning accuracy. The thickness of the light-shielding film in this case is adjusted to an optical density of 2.5 or more in a combination with the half-tone phase-shifter film, as in the aspect 10.

As in the aspect 11, the photomask blank according the present invention is one for dry etching being provided for a method of producing a photomask by patterning the light-shielding film by dry etching using a resist pattern formed on the light-shielding film as a mask.

Furthermore, as in the aspect 12, in a method of producing a photomask including a process of patterning the light-shielding film of the photomask blank by dry etching according to any one of the aspects 3 to 11, the light-shielding film substantially does not have a film stress, and a good mask pattern with a high accuracy can be formed by using a photomask blank having good flatness. Consequently, a photomask that can provide high pattern-transferring accuracy can be obtained.

Furthermore, as in the aspect 13, in a method of producing a photomask for forming a half-tone phase-shifter film pattern on a light-transmitting substrate by patterning the light-shielding film of the photomask blank by dry etching according to any one of the aspects 8 to 10, a light-shielding film pattern is formed on a half-tone phase-shifter film, and then the half-tone phase-shifter film is patterned by dry etching using the light-shielding film pattern as a mask. Thus, a photomask that can provide high pattern-transferring accuracy corresponding to micro patterns can be obtained.

As in the aspect 14, the method of producing a photomask blank according to the present invention comprises a process of forming a light-shielding film containing chromium and nitrogen on a light-transmitting substrate by sputtering using a target of chromium or having a main component of chromium in atmosphere containing a helium gas and at least one of a nitrogen gas and a nitrogen compound gas. The method is characterized in that the flow rate of at least one of the nitrogen gas, the nitrogen compound gas, and the helium gas contained in the sputtering atmosphere is adjusted so that the light-shielding film has a desired film stress in the direction opposite to that of a change in the film stress that is caused by heat treatment applied to the light-shielding film after the formation of the light-shielding film and thereby the flatness of the photomask blank is a predetermined level or less.

With this, the light-shielding film substantially does not have a film stress when a resist film has been formed on the light-shielding film and necessary heat treatment has been conducted, and accordingly a photomask blank with good flatness can be obtained.

Here, examples of the nitrogen compound gas include nitrogen monoxide gas (NO gas) and dinitrogen monoxide gas ($N_2O$ gas).

Furthermore, as in the aspect 15, the heat treatment of the light-shielding film is conducted before the formation of a resist film on the light-shielding film or after the formation of the resist film. In general, in a process of producing a photomask blank, heat treatment at a high temperature after the formation of the light-shielding film is bake treatment conducted before the formation of the resist film for improving adhesion or prebake treatment conducted after the formation of the resist film. These heat treatment processes cause a large change in the film stress of the light-shielding film. Accordingly, it is preferable that the gas flow rate of one of the nitrogen gas, the nitrogen compound gas, and the helium gas contained in the sputtering atmosphere be adjusted to these heat treatment processes.

Furthermore, as in the aspect 16, since a light-shielding film containing chromium is imparted with a tensile stress by heat treatment, it is preferable that the amount of nitrogen be previously adjusted so that a compression stress is caused.

Furthermore, as in the aspect 17, prevention of deterioration in the cross-sectional shape of a light-shielding film pattern and suppression of a global loading phenomenon are possible by adjusting the gas flow rate of at least one of the nitrogen gas, the nitrogen compound gas, and the helium gas so that the selection ratio of the light-shielding film to a resist formed on the light-shielding film exceeds 1.

Furthermore, as in the aspect 18, a half-tone phase-shifter film may be formed between the light-transmitting substrate and the light-shielding film. A half-tone phase-shift mask having such a half-tone phase-shifter film can particularly improve the resolution and is thus remarkably suitable for forming a micro mask pattern. In such a case, as in the aspect 19, when the half-tone phase-shifter film has a transmittance of 10% or more and 40% or less to exposure light, the present invention is particularly suitable. That is, in a half-tone phase-shift mask having a phase-shifter film with a high transmittance to exposure light, a portion that is fundamentally required to be completely shielded from light is more completely shielded from light by a structure that a light-shielding film is formed at a portion that is in a region where a mask pattern of the phase-shifter film is formed and is other than the boundary with a light-transmitting portion (portion where a mask pattern is not formed and a light-transmitting substrate is exposed) of the mask pattern. Therefore, superiority and inferiority of the flatness of the photomask blank highly affect the patterning accuracy. The thickness of the light-shielding film in this case is adjusted to an optical density of 2.5 or more in a combination with the half-tone phase-shifter film, as in the aspect 20.

As in the aspect 21, the photomask blank according to the present invention is one for dry etching being provided for a method of producing a photomask by patterning the light-shielding film by dry etching using a resist pattern formed on the light-shielding film as a mask.

Furthermore, as in the aspect 22, in a method of producing a photomask including a process of patterning the light-shielding film of the photomask blank by dry etching according to any one of the aspects 14 to 21, the light-shielding film substantially does not have a film stress, and a good mask pattern with a high accuracy can be formed by using a photomask blank having good flatness. Consequently, a photomask that can provide high pattern-transferring accuracy can be obtained.

Furthermore, as in the aspect 23, in a method of producing a photomask for forming a half-tone phase-shifter film pattern on a light-transmitting substrate by patterning the light-shielding film of the photomask blank by dry etching according to any one of the aspects 18 to 20, a light-shielding film pattern is formed on a half-tone phase-shifter film, and then the half-tone phase-shifter film is patterned by dry etching using the light-shielding film pattern as a mask. Thus, a photomask that can provide high pattern-transferring accuracy corresponding to micro patterns can be obtained.

Furthermore, as in the aspect 14, since the light-shielding film pattern or the half-tone phase-shifter film pattern of the photomask according to any one of the aspects 12, 13, 22, and 23 is transferred onto a semiconductor substrate by photolithography, a semiconductor device not having defects in a circuit pattern formed on the semiconductor substrate can be produced.

Advantages of Invention

The present invention can provide a photomask blank that can provide good flatness when a light-shielding film is patterned. In addition, a high mask patterning accuracy can be obtained by producing a photomask using such a photomask blank having good flatness. Furthermore, the present invention can provide a photomask that can provide a high pattern-transferring accuracy when a pattern is transferred.

Furthermore, a good semiconductor device without a defect in a circuit pattern can be obtained by transferring the pattern on a semiconductor substrate using the photomask of the present invention.

Figures 1, 2:
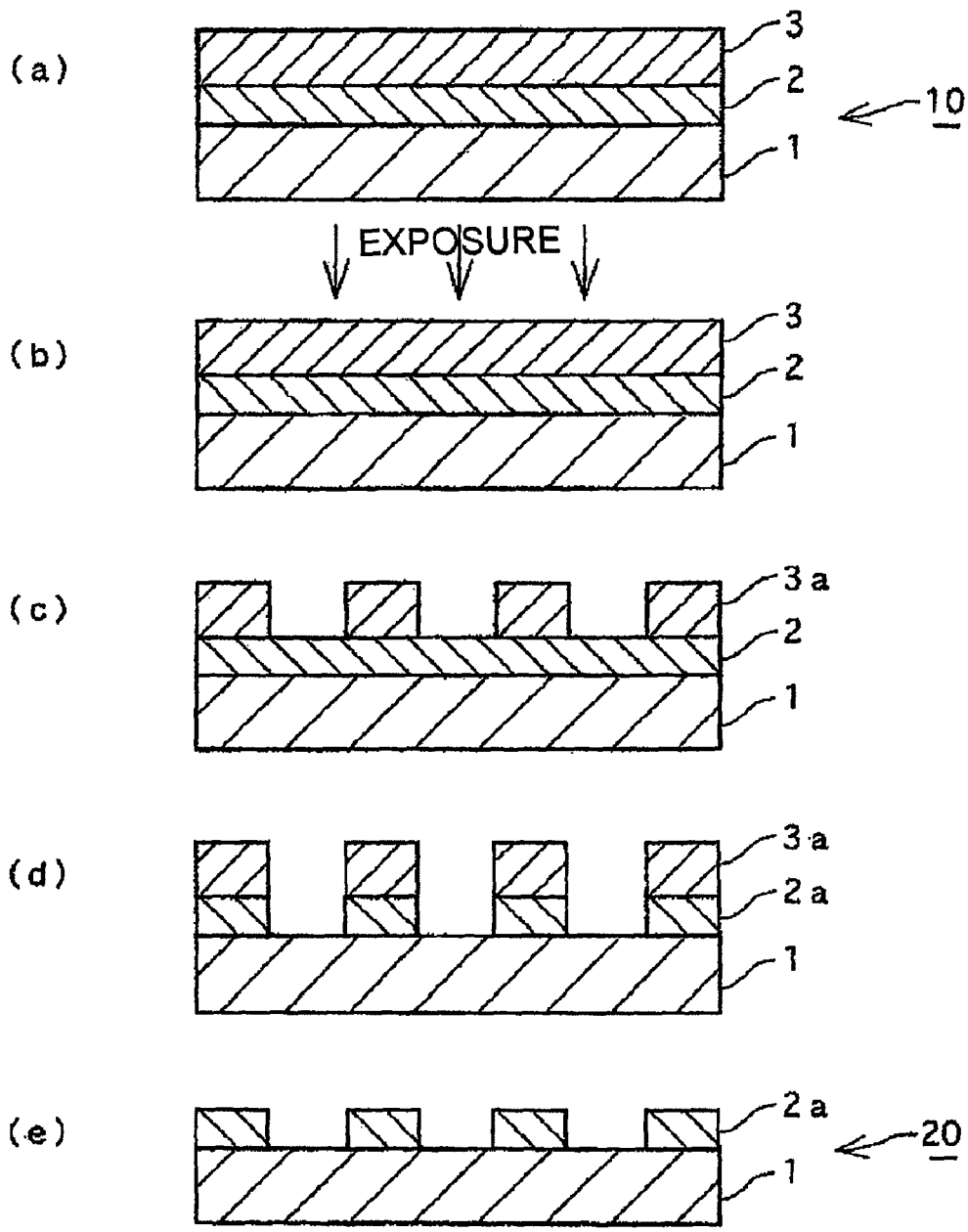
FIG. 1 is a cross-sectional view showing a photomask blank prepared according to a first embodiment of the present invention.
FIG. 2 is cross-sectional views showing a process producing a photomask using a photomask blank.

REFERENCE NUMERALS 1 light-transmitting substrate
2 light-shielding film
3 resist film
4 half-tone phase-shifter film
5 light-shielding layer
6 reflection-preventing layer
2a light-shielding film pattern
3a resist pattern
10, 30 photomask blank
20, 40 photomask

BEST MODES FOR CARRYING OUT THE INVENTION

Embodiments of the present invention will now be described in detail with reference to the drawings.

FIG. 1 is a cross-sectional view showing a photomask blank prepared according to a first embodiment of the present invention.

A photomask blank 10 in FIG. 1 is that for a binary mask having a light-shielding film 2 on a light-transmitting substrate 1.

The photomask blank 10 of this embodiment is a mask blank for dry etching treatment that corresponds to a method of producing a photomask by patterning the light-shielding film 2 by dry etching using a resist pattern formed on the light-shielding film 2 as a mask. Here, the light-transmitting substrate 1 is usually a glass substrate. Since a glass substrate is excellent in flatness and smoothness, a pattern can be transferred with a high accuracy not to cause a warp in the transferred pattern when the pattern is transferred to a semiconductor substrate by using a photomask.

In the photomask blank 10, the light-shielding film 2 is formed to have a desired film stress in the direction opposite to that of a change in the film stress that is anticipated to be caused in the light-shielding film by heat treatment according to a resist film formed on the light-shielding film.

Thus, the light-shielding film is formed so as to cause a desired film stress in the direction opposite to that of a change in the film stress that is anticipated to be caused in the light-shielding film by heat treatment. Therefore, the film stress of the light-shielding film can be substantially canceled by the change in the film stress that is caused by the subsequent heat treatment. As a result, good flatness can be provided to a photomask blank when the light-shielding film is patterned. That is, in the photomask blank 10 according to this embodiment, the light-shielding film 2 substantially does not have a film stress and is in a state of good flatness when a resist film is formed on the light-shielding film 2 and necessary heat treatment is conducted. Consequently, a high mask patterning accuracy can be achieved in the subsequent patterning of the light-shielding film.

The heat treatment according to a resist film is bake treatment of the resist film formed on a light-shielding film. When a photomask is formed using a photomask blank, the bake treatment is generally conducted before and after (in general, called prebake) the formation of the resist film on the light-shielding film or after the formation of the resist film. The heating conditions for the bake treatment are determined depending on the type of resist, and a high temperature of approximately 120° C. or more is employed. With the heat treatment at such a high temperature, a change in the stress of the chromium light-shielding film is caused, and thereby the flatness of the substrate having the light-shielding film is highly deteriorated. For example, as understood with reference to FIG. 6 relating to an Example described below, the film stress of the light-shielding film is increased with the bake temperature of the resist film formed on the chromium light-shielding film to increase the flatness variation of the substrate having the light-shielding film. Here, the flatness variation is defined as the difference between the flatness of the substrate after the bake treatment and the flatness of the substrate before the bake treatment (the substrate having the light-shielding film, the same is applied hereinafter) as the initial value. The sign "−(minus)" of flatness variation shows a change in the stress in the tensile direction, and the sign "+(plus)" shows a change in the stress in the compression direction. On the basis of such correlation between the bake temperature and the flatness variation, a change in the film stress of the light-shielding film caused by heat treatment (bake treatment) is previously anticipated according to a resist film. Here, it is desirable that a change in film stress when the film stress of the light-shielding film is most highly changed, namely, a change in film stress when the heat treatment (bake treatment) after the formation of the light-shielding film is conducted at the highest temperature, is taken into consideration.

Figure 7:
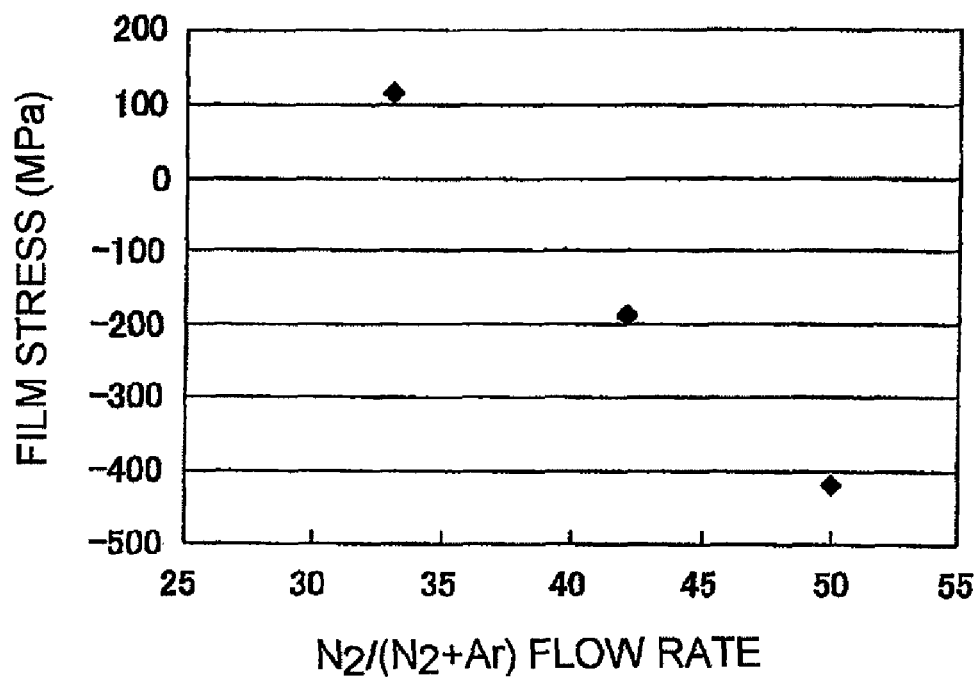
FIG. 7 is a graph showing a relationship between the nitrogen flow rate in atmosphere for forming a light-shielding film and the film stress.

The light-shielding film 2 is formed so as to have a desired film stress in the direction opposite to that of a change in the film stress that is anticipated to be caused in the light-shielding film by heat treatment according to a resist film formed on the light-shielding film. This is achieved, for example, by adjusting the film stress of the light-shielding film so that a desired film stress is imparted to the light-shielding film by controlling the nitrogen content in the light-shielding film. That is, in a case of a light-shielding film containing chromium, heat treatment generally causes a change in film stress in the tensile direction. Therefore, in order to previously impart a desired film stress to the light-shielding film in the direction opposite to this, i.e., in the compression direction, the nitrogen content in the light-shielding film is controlled to adjust the film stress of the light-shielding film when the film is formed. For example, as shown in FIG. 7 relating to an Example described below, the film stress (compression stress) of a chromium light-shielding film when the film is formed can be adjusted by increasing the flow rate of a nitrogen gas to an argon gas in atmosphere when the chromium light-shielding film is sputtered. Here, the sign "−(minus)" shows a film stress in the compression direction, and the sign "+(plus)" shows a film stress in the tensile direction.

Thus, the nitrogen content in the light-shielding film is adjusted to cancel a change in the film stress that is anticipated to be caused in the light-shielding film by heat treatment. More specifically, it is preferable that the nitrogen content in the light-shielding film be adjusted so that the light-shielding film has a desired film stress in the direction opposite to that of a change in the film stress that is caused in the light-shielding film by heat treatment and thereby the obtained flatness of the photomask blank is a predetermined level or less. The nitrogen content is preferably adjusted so that the flatness of the photomask blank after the formation of a light-shielding film containing the controlled amount of nitrogen and heat treatment of the light-shielding film is 0.5 μm or less. More preferably, the flatness of the photomask blank is 0.25 μm or less.

Furthermore, a correlation between the nitrogen content (nitrogen gas flow rate) in atmosphere when a light-shielding film is formed and the film stress of the formed light-shielding film is determined, and a change in the film stress of the light-shielding film caused by heat treatment according to a resist film formed on the light-shielding film is anticipated. Then, an amount of nitrogen that causes a desired film stress in the direction opposite to that of the above change in the film stress is determined from the aforementioned correlation, and the light-shielding film is formed by sputtering in atmosphere containing this amount of nitrogen. In addition, it is preferable that the nitrogen content be controlled in consideration of a change in the film stress by heat treatment at the highest temperature in conditions for heat treatment (bake treatment) after the formation of the light-shielding film.

In the aforementioned photomask blank, a difference in flatness between that of the substrate before the formation of the light-shielding film and that of the substrate after the formation of the light-shielding film and the heat treatment (bake treatment) is preferably 0.10 μm or less. Thus, since the flatness variation of the substrate after the formation of the light-shielding film and the heat treatment (bake treatment) from the flatness of the substrate before the formation of the light-shielding film is very small of 0.10 μm or less, a photomask blank that can provide good flatness when the light-shielding film is patterned can be obtained.

Figure 9:
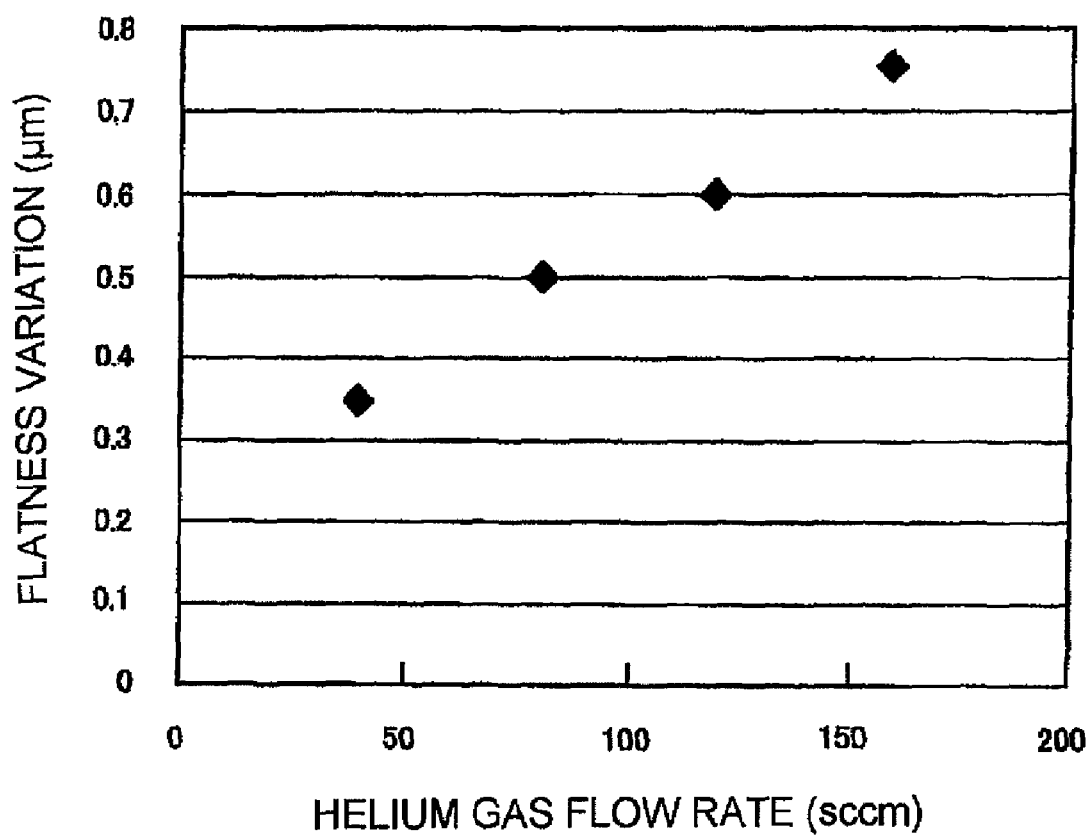
FIG. 9 is a graph showing a relationship between the helium gas flow rate in atmosphere for forming a light-shielding film and the film stress.

Furthermore, the light-shielding film 2 is formed so as to have a desired film stress in the direction opposite to that of a change in the film stress that is anticipated to be caused in the light-shielding film by heat treatment according to a resist film formed on the light-shielding film. The desired film stress is imparted to the light-shielding film, for example, by using a gas mixture containing a helium gas and at least one of a nitrogen gas and a nitrogen compound gas as the atmospheric gas when the light-shielding film is formed and adjusting the film stress of the light-shielding film by controlling the flow rate of at least one of the nitrogen gas, the nitrogen compound gas, and the helium gas contained in sputtering atmosphere. That is, in a case of a light-shielding film containing chromium, heat treatment generally causes a change in film stress in the tensile direction. Therefore, in order to previously impart a desired film stress to the light-shielding film in the direction opposite to this, i.e., in the compression direction, the film stress of the light-shielding film when the film is formed is adjusted by controlling the flow rate of at least one of the nitrogen gas, the nitrogen compound gas, and the helium gas contained in sputtering atmosphere. For example, as shown in FIG. 9 relating to an Example described below, the film stress (compression stress) of a chromium light-shielding film when the film is formed can be adjusted by increasing the flow rate ratio of the helium gas in atmosphere when the chromium light-shielding film is sputtered. Here, the sign "−(minus)" of flatness variation of the vertical axis shows a film stress in the tensile direction, and the sign "+(plus)" shows a film stress in the compression direction.

Thus, the gas flow rate of at least one of the nitrogen gas, the nitrogen compound gas, and the helium gas contained in sputtering atmosphere is adjusted to cancel a change in the film stress that is caused in the light-shielding film by heat treatment. More specifically, it is preferable that the gas flow rate of at least one of the nitrogen gas, the nitrogen compound gas, and the helium gas contained in sputtering atmosphere be adjusted so that the light-shielding film has a desired film stress in the direction opposite to that of a change in the film stress that is caused in the light-shielding film by heat treatment and thereby the obtained flatness of the photomask blank is a predetermined level or less. The gas flow rate is preferably adjusted so that the flatness of the photomask blank is 0.5 µm or less when the photomask blank is produced by forming a light-shielding film by sputtering under a controlled gas flow rate of at least one of the nitrogen gas, the nitrogen compound gas, and the helium gas contained in the sputtering atmosphere and heating the light-shielding film. More preferably, the flatness of the photomask blank is 0.25 µm or less.

Furthermore, a correlation between the nitrogen gas flow rate, the nitrogen compound gas flow rate, or the helium gas flow rate in atmosphere when a light-shielding film is formed by sputtering and the film stress of the formed light-shielding film is determined, and a change in the film stress of the light-shielding film caused by heat treatment according to a resist film formed on the light-shielding film is anticipated. Then, a nitrogen gas flow rate, a nitrogen compound gas flow rate, or a helium gas flow rate that causes a desired film stress in the direction opposite to that of the above change in the film stress is determined from the aforementioned correlation, and the light-shielding film is formed by sputtering in atmosphere containing this gas flow rate. In addition, it is preferable that the nitrogen gas flow rate, the nitrogen compound gas flow rate, or the helium gas flow rate be controlled in consideration of a change in the film stress by heat treatment at the highest temperature in conditions for heat treatment (bake treatment) after the forming of the light-shielding film.

In the aforementioned photomask blank, a difference in flatness between that of the substrate before the formation of the light-shielding film and that of the substrate after the formation of the light-shielding film and heat treatment (bake treatment) is preferably 0.10 µm or less. Thus, since the flatness variation of the substrate after the formation of the light-shielding film and the heat treatment (bake treatment) from the flatness of the substrate before the formation of the light-shielding film is very small of 0.10 µm or less, a photomask blank that can provide good flatness when the light-shielding film is patterned can be obtained.

The light-shielding film 2 is preferably made of a material having a dry etching selection ratio exceeding 1 to a resist so that a resist film remains when the patterning of the light-shielding film is finished, even if a film thickness loss of the resist film occurs when patterning is conducted by dry etching using the resist pattern formed on the light-shielding film 2 as a mask. The selection ratio is expressed by the ratio of a film thickness loss of the light-shielding film to a film thickness loss of the resist (=film thickness loss of light-shielding film/film thickness loss of resist). The selection ratio of the light-shielding film to the resist is preferably higher than 1 but not exceeding 10 and more preferably higher than 1 but not exceeding 5 from the viewpoints of prevention of deterioration in the cross-sectional shape of the light-shielding film pattern and suppression of a global loading phenomenon.

Specific example of the material of the light-shielding film 2 is a material containing chromium and an additive element that can accelerate the dry etching rate so that the rate is higher than that of chromium alone. The additive element that can accelerate the dry etching rate to be higher than that of chromium alone preferably contains at least one of oxygen and nitrogen. Nitrogen also contributes to the aforementioned adjustment of the film stress of a light-shielding film.

When the light-shielding film 2 contains oxygen, the oxygen content is preferably in the range of 5 to 80 at %. When the oxygen content is less than 5 at %, an effect of accelerating the dry etching rate to be higher than that of chromium alone is hardly achieved. On the other hand, when the oxygen content is higher than 80 at %, an absorption coefficient in a wavelength of 200 nm or less, for example, an ArF excimer laser (wavelength: 193 nm), is decreased. Consequently, the film thickness is required to be large sufficient for obtaining a desired optical density (for example, 2.5 or more). In addition, the oxygen content in the light-shielding film 2 is preferably in the range of 60 to 80 at % particularly from the viewpoint of reducing the amount of oxygen in the dry etching gas.

Furthermore, it is also preferable that the light-shielding film 2 contain nitrogen as an additive element that can accelerate the drying etching rate to be higher than that of chromium alone. When the light-shielding film 2 contains nitrogen, the nitrogen content is preferably in the range of 20 to 80 at %. When the nitrogen content is less than 20 at %, an effect of accelerating the dry etching rate to be higher than that of chromium alone is hardly achieved. On the other hand, when the nitrogen content is higher than 80 at %, an absorption coefficient in a wavelength of 200 nm or less, for example, an ArF excimer laser (wavelength: 193 nm), is decreased. Consequently, the film thickness is required to be large sufficient for obtaining a desired optical density (for example, 2.5 or more).

In addition, the nitrogen content in the light-shielding film 2 is preferably in the range of 30 to 60 at % and more preferably 35 to 50 at % in consideration of adjustment of the film stress of the light-shielding film 2 and the dry etching rate.

Furthermore, the light-shielding film 2 may contain both oxygen and nitrogen. In such a case, the total content of oxygen and nitrogen is preferably in the range of 10 to 80 at %. The content ratio of oxygen and nitrogen when the light-shielding film 2 contains both oxygen and nitrogen is not particularly limited and is arbitrarily determined in consideration of the absorption coefficient and so on.

The light-shielding film 2 may be formed by any method without particular limitation. In particular, sputtering is preferred. Sputtering can uniformly form a film with a uniform thickness and is preferred for the present invention. In a case that the light-shielding film 2 is formed on a light-transmitting substrate 1 by sputtering, a chromium (Cr) target is used as the sputtering target, the sputtering gas introduced into a chamber is a gas mixture of an inert gas, such as an argon gas or a helium gas, and a gas, such as oxygen, nitrogen, carbon dioxide, or nitrogen monoxide. An oxygen-containing chromium light-shielding film can be formed by using a sputtering gas being a mixture of an inert gas, such as argon gas, and an oxygen gas or a carbon dioxide gas. A nitrogen-containing chromium light-shielding film can be formed by using a sputtering gas being a mixture of an inert gas, such as argon gas, and a nitrogen gas. A nitrogen- and oxygen-containing chromium light-shielding film can be formed by using a sputtering gas being a mixture of an inert gas, such as argon gas, and a nitrogen monoxide gas. Furthermore, a carbon-containing chromium light-shielding film can be formed by using a sputtering gas being a mixture of an inert gas, such as argon gas, and a methane gas.

The thickness of the light-shielding film 2 is determined so that the optical density to exposure light is 2.5 or more. Specifically, the thickness of the light-shielding film 2 is preferably 90 nm or less in order to correspond to a micro pattern having a pattern size of a submicron level in recent years. That is because, when the thickness is larger than 90 nm, it is difficult to form a micro pattern due to a micro loading phenomenon and the like of the pattern during the etching. The aspect ratio of the pattern (the ratio of a pattern depth to a pattern width) can be decreased by reducing the thickness to some extent, and thereby a line width error due to a global loading phenomenon and a micro loading phenomenon can be decreased. Furthermore, in particular, a pattern having a pattern size of a submicron level can be prevented from damage (such as collapse) by reducing the film thickness to some extent. The light-shielding film 2 in the present invention can obtain a desired optical density (for example, 2.5 or more) in an exposure wavelength of 200 nm or less, even if the film thickness is 90 nm or less. The thickness of the light-shielding film 2 can be reduced within the range that a desired optical density can be obtained.

The light-shielding film 2 may be a monolayer film or a multilayer film, and both films preferably contain oxygen and/or nitrogen. For example, the light-shielding film 2 may have a reflection-preventing layer at the superficial portion (upper layer). In such a case, the material of the reflection-preventing layer is preferably, for example, CrO, CrCO, CrNO, or CrCON. The present of the reflection-preventing layer can suppress the reflectance in an exposure wavelength to, for example, 20% or less and preferably to 15% or less. Therefore, when a mask pattern is transferred to a transfer target, multiple reflections at a projective exposure face can be prevented to inhibit a decrease in an image formation property. In addition, it is desirable that the reflectance to a wavelength (for example, 257 nm, 364 nm, or 488 nm) used for defect inspection of a photomask blank or a photomask be, for example, 30% or less for detecting defect at a high accuracy. In particular, the reflection-preventing layer containing carbon can reduce the reflectance to an exposure wavelength and also reduce the reflectance to the inspection wavelength (in particular, 257 nm) to 20% or less and therefore preferred. Specifically, the carbon content is preferably 5 to 20 at %. When the carbon content is less than 5 at %, an effect of reducing the reflectance is insufficient. When the carbon content is higher than 20 at %, the dry etching rate is decreased. Therefore, the dry etching for patterning the light-shielding film takes a longer time to make it difficult to reduce the thickness of a resist film. Thus, it is not preferred.

In addition, the reflection-preventing layer may be disposed at the light-transmitting substrate side, according to need.

Furthermore, the light-shielding film 2 may be a compositionally gradient film in which the contents of chromium and an element such as oxygen, nitrogen, or carbon vary in the depth direction so that the composition stepwise or continuously changes in the reflection-preventing layer disposed at the superficial portion and the other layer (light-shielding layer). The light-shielding film can be formed as a compositionally gradient film by, for example, forming the film while arbitrarily changing the sputtering gas type (composition) during the sputtering.

The photomask blank may be in a form that a resist film 3 is formed on the light-shielding film 2 as shown in FIG. 2(a) described below. The thickness of the resist film 3 is preferably as thin as possible for achieving a high patterning accuracy (CD accuracy) of the light-shielding film. In a case of a so-called photomask blank for a binary mask as in this embodiment, specifically, the thickness of the resist film 3 is preferably 300 nm or less, more preferably 200 nm or less, and most preferably 150 nm or less. The lower limit of the resist film thickness is determined so that the resist film remains when the light-shielding film is dry etched using the resist pattern as a mask. Furthermore, the resist film 3 is preferably a chemically amplified resist made of a material having high resist sensitivity for obtaining a high resolution.

A method of producing a photomask using a photomask blank 10 shown in FIG. 1 will now be described.

This method for producing a photomask using a photomask blank 10 includes a process of patterning a light-shielding film 2 of the photomask blank 10 by dry etching. Specifically, the method includes a process of subjecting a resist film formed on the photomask blank 10 to a desired patterning exposure (pattern drawing), a process of forming a resist pattern by developing the resist film according to a desired patterning exposure, a process of etching the light-shielding film according to the resist pattern, and a process of peeling and removing the remaining resist pattern.

FIG. 2 is cross-sectional views showing a process producing a photomask using a photomask blank 10.

FIG. 2(a) shows a state that a resist film 3 is formed on the light-shielding film 2 of the photomask blank 10 of FIG. 1. The resist material may be a positive resist material or a negative resist material.

Then, FIG. 2(b) shows a process of subjecting the resist film 3 formed on the photomask blank 10 to a desired patterning exposure (pattern drawing). The patterning exposure is conducted using an electron beam drawing apparatus or the like. The aforementioned resist material has photosensitivity to an electron beam or a laser beam.

Then, FIG. 2(c) shows a process of forming a resist pattern by developing the resist film 3 according to a desired patterning exposure. In this process, a resist pattern 3a is formed by subjecting the resist film 3 formed on the photomask blank 10 to a desired patterning exposure and then supplying a developing solution for dissolving a portion of the resist film that is dissoluble to the developing solution.

Then, FIG. 2(d) shows a process of etching the light-shielding film 2 according to the resist pattern 3a. Since the photomask blank according to the present invention is suitable for dry etching, the etching is preferably conducted by dry etching. In this etching process, the light-shielding film 2 is removed by dry etching using the resist pattern 3a as a mask at the portion where the resist pattern 3a is not formed and the light-shielding film 2 is exposed. With this process, a desired light-shielding film pattern 2(a) (mask pattern) is formed on the light-transmitting substrate 1.

In this dry etching, it is suitable for the present invention to use a dry etching gas of a chlorine-based gas or a gas mixture containing a chlorine-based gas and an oxygen gas. In a light-shielding film 2 composed of materials containing chromium and an element such as oxygen or nitrogen in the present invention, the dry etching rate can be increased by conducting the dry etching using the above dry etching gas. Thus, the dry etching time can be reduced, and a light-shielding film pattern having a good cross-sectional shape can be formed. Examples of the chlorine-based gas used as the dry etching gas include $Cl_2$, $SiCl_4$, HCl, $CCl_4$, and $CHCl_3$.

In addition, in a case of that the light-shielding film is made of materials containing oxygen-containing chromium, chromyl chloride is generated by a reaction of oxygen, chromium, and the chlorine-based gas in the light-shielding film. Therefore, when the dry etching gas used for dry etching is a gas mixture of a chlorine-based gas and an oxygen gas, the oxygen content in the dry etching gas can be decreased according to the oxygen content contained in the light-shielding film. By conducting the dry etching using a dry etching gas of which oxygen content is thus decreased, the amount of oxygen, which adversely affects the resist pattern, can be decreased, and the resist pattern is prevented from damage during the dry etching. Consequently, a photomask having an improved patterning accuracy of the light-shielding film can be obtained. Furthermore, a dry etching gas not containing oxygen, namely, the oxygen content is zero, can be used depending on the amount of oxygen contained in the light-shielding film.

FIG. 2(e) shows a photomask 20 that is obtained by peeling and removing the remaining resist pattern 3a. Thus, a photomask precisely provided with a light-shielding film pattern having a good cross-sectional shape can be formed.

The present invention is not limited to the above-described embodiment. That is, the photomask blank of the present invention is not limited to a so-called photomask blank for a binary mask in which a light-shielding film is formed on a light-transmitting substrate. The photomask blank may be, for example, a photomask blank used for producing a half-tone phase-shift mask. In such a case, as shown in a second embodiment described below, a photomask blank has a structure in which a light-shielding film is formed on a half-tone phase-shifter film on a light-transmitting substrate. Since a desired optical density (for example, 2.5 or more) may be achieved by a combination of the half-tone phase-shifter film and the light-shielding film, the optical density of the light-shielding film itself may be less than, for example, 2.5.

A photomask blank according to a second embodiment of the present invention will now be described with reference to FIG. 3(a).

A photomask blank 30 in FIG. 3(a) includes a half-tone phase-shifter film 4 on a light-transmitting substrate 1 and a light-shielding film 2 composed of a light-shielding layer 5 and a reflection-preventing layer 6 on the half-tone phase-shifter film 4. Since the light-transmitting substrate 1 and the light-shielding film 2 have been described in the above first embodiment, the description thereof is omitted.

The half-tone phase-shifter film 4 transmits high intensity light that substantially does not contribute to exposure (for example, 1% to 30% to exposure wavelength) and has a predetermined phase difference. This half-tone phase-shifter film 4 is formed so that the phase of light passed through the light semi-transmitting portion is substantially opposite to that of light passed through the light-transmitting portion. This is achieved by a light-semi-transmitting portion where the half-tone phase-shifter film 4 is patterned and a light-transmitting portion where the half-tone phase-shifter film 4 is not formed and high intensity light substantially contributing to exposure is transmitted. Consequently, light that passes through near the boundary between the light-semi-transmitting portion and the light-transmitting portion and enters the other region by diffraction phenomena of each other to counterbalance each other. As a result, the light intensity at the boundary becomes approximately zero to improve contrast at the boundary, namely, improve the resolution.

The half-tone phase-shifter film 4 is preferably made of a material having an etching property different from that of the light-shielding film 2 formed thereon. Examples of the material of the half-tone phase-shifter film 4 include metals such as molybdenum, tungsten, tantalum, and hafnium; silicon; and materials having oxygen and/or nitrogen as the main components. In addition, the half-tone phase-shifter film 4 may be a monolayer film or a multilayer film.

The light-shielding film 2 in the second embodiment has an optical density of 2.5 or more to exposure light in a lamination structure of a half-tone phase-shift film and a light-shielding film. In such a light-shielding film 2, the thickness is preferably 50 nm or less. The reason of this is the same as that in the above first embodiment. That is, it is difficult in some cases to form a micro pattern due to a micro loading phenomenon and the like of the pattern during the etching. Furthermore, in this embodiment, the thickness of the resist film formed on the reflection-preventing layer 6 is preferably 250 nm or less, more preferably 200 nm or less, and most preferably 150 nm or less. The lower limitation of the resist film thickness is determined so that the resist film remains when the light-shielding film is dry etched using the resist pattern as a mask. Furthermore, as in the above-described embodiment, the resist film is preferably a chemically amplified resist made of a material having high resist sensitivity for obtaining a high resolution.

EXAMPLES

The embodiments of the present invention will now be more specifically described by Examples. In addition, Comparative Example with respect to the Examples will be described.

Example 1

Figure 3:
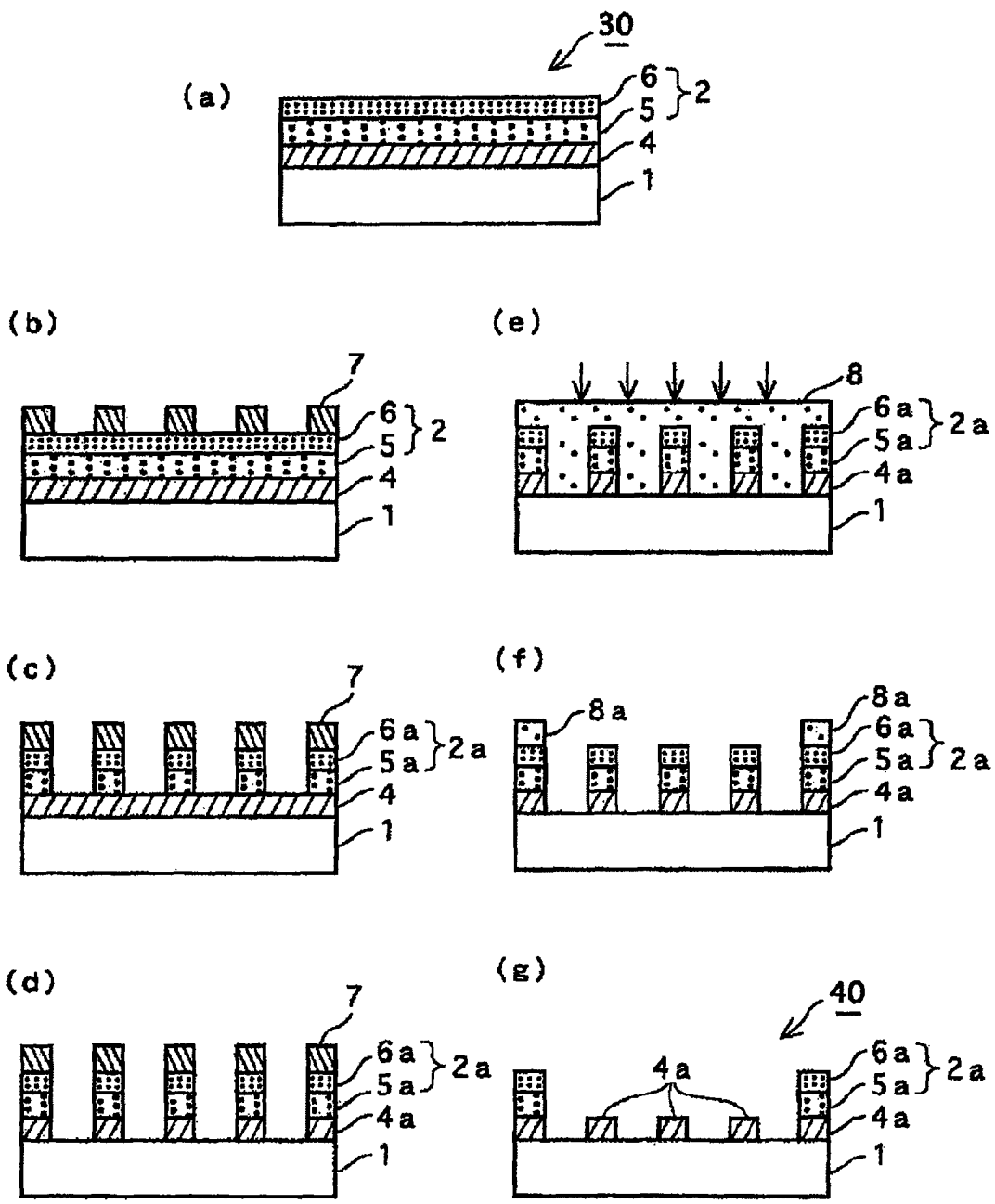
FIG. 3 is cross-sectional views showing a photomask blank prepared according to a second embodiment of the present invention and a process producing a photomask using this photomask blank.

FIG. 3 is cross-sectional views showing a photomask blank prepared according to this Example and a process producing a photomask using this photomask blank. As shown in FIG. 3(a), a photomask blank 30 in this embodiment includes a half-tone phase-shifter film 4 on a light-transmitting substrate 1 and a light-shielding film 2 composed of a light-shielding layer 5 and a reflection-preventing layer 6 on the half-tone phase-shifter film 4.

This photomask blank 30 can be produced by the following method.

A half-tone phase-shifter film for an ArF excimer laser (wavelength: 193 nm) was formed on a light-transmitting substrate (size: 152 mm×152 mm) by reactive sputtering (DC sputtering) using a cluster-type sputtering apparatus so as to have a thickness of 69 nm. The light-transmitting substrate was made of synthetic silica glass having a main surface finished into a convex shape by precisely polishing the main surface and end faces and having a flatness of 0.29 μm. The sputtering was conducted using a mixture of molybdenum (Mo) and silicon (Si) (Mo: Si=8:92 mol %) as a sputtering target in atmosphere of a gas mixture of argon (Ar), helium (He), and nitrogen ($N_2$) (Ar:He:$N_2$=10 vol %:40 vol %:50 vol %). The half-tone phase-shifter film was formed as a monolayer having main components of molybdenum, silicon, and nitrogen, and was heated at 400° C. Furthermore, this half-tone phase-shifter film 4 had a transmittance of 5.5% and a phase sift amount of approximately 180° in the ArF excimer laser (wavelength: 193 nm). The flatness of the substrate provided with this phase-shifter film was 0.29 μm, and the main surface of the light-transmitting substrate was a convex shape. Here, the flatness is defined as the difference between the maximum height and the minimum height of the surface shape in a main surface plane from a reference plane arbitrarily determined at the surface side of the main surface of the light-transmitting substrate (the difference between the maximum and minimum values of a measurement plane to a virtual absolute plane (focal plane) calculated by the method of least squares from the measurement plane). The flatness was measured for a rectangular region of 142 mm×142 mm with a flatness meter (Tropel) (the same applied hereinafter).

Figure 6:
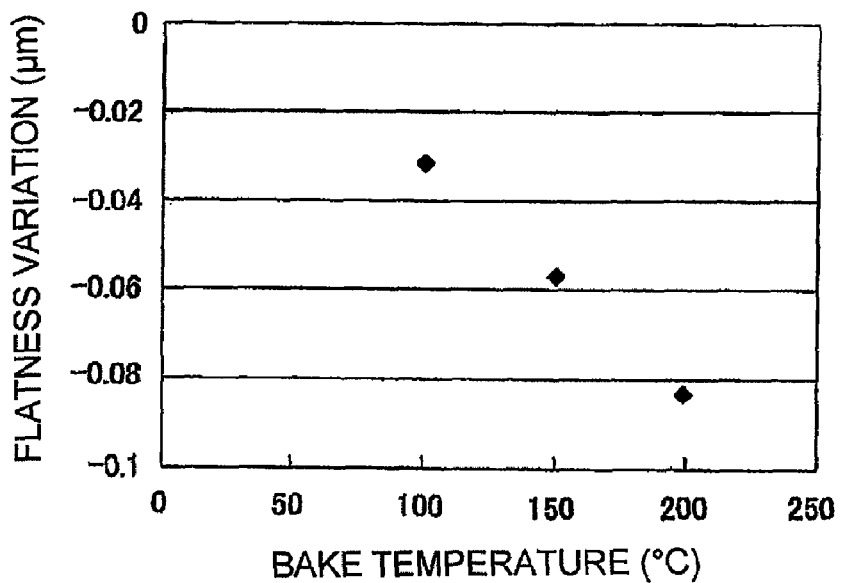
FIG. 6 is a graph showing a relationship between bake temperature and flatness variation in a substrate with a light-shielding film.

Then, a light-shielding layer was formed by reactive sputtering using a chromium target as the sputtering target in atmosphere of a gas mixture of argon, nitrogen, and helium (Ar: 30 vol %, $N_2$: 30 vol %, He: 40 vol %) using an in-line type sputtering apparatus. During the formation of the light-shielding layer, the power of the sputtering apparatus was 0.80 kW, the total gas pressure was 0.17 pascal (Pa). Then, the power of the sputtering apparatus was decreased to 0.33 kW and the total gas pressure was adjusted to 0.28 pascal (Pa), and a reflection-preventing layer was formed by reactive sputtering in atmosphere of a gas mixture of argon, methane, and helium (Ar: 54 vol %, $CH_4$: 6 vol %, He: 40 vol %) and then in atmosphere of a gas mixture of argon and nitrogen monoxide (Ar: 90 vol %, NO: 10 vol %). Thus, a light-shielding film having a total thickness of 48 nm and consisting of the light-shielding layer and the reflection-preventing layer was formed. In addition, a relationship, as shown in FIG. 6, of flatness variation before and after bake treatment of a substrate (glass substrate having the aforementioned light-shielding film thereon) and bake temperature was preliminarily investigated. A relationship, as shown in FIG. 7, of film stress of a light-shielding film and a nitrogen gas flow rate in gas mixture atmosphere for forming the light-shielding film was also preliminarily investigated. Then, from FIG. 6, a change in the film stress of a light-shielding film was anticipated based on the flatness variation in a substrate at the bake temperature (160° C.) before the formation of a resist film on the light-shielding film. The bake temperature is the highest heating temperature applied to the light-shielding film. Then, a nitrogen content (nitrogen gas flow rate) that causes a desired film stress in the direction opposite to the anticipated change in the film stress was determined from the relationship shown in FIG. 7. The aforementioned light-shielding film was formed by sputtering in atmosphere containing the above-determined amount of nitrogen. The flatness of the substrate at the point when the light-shielding film was formed was 0.42 μm, and the main surface of the substrate was a convex shape.

Figure 5:
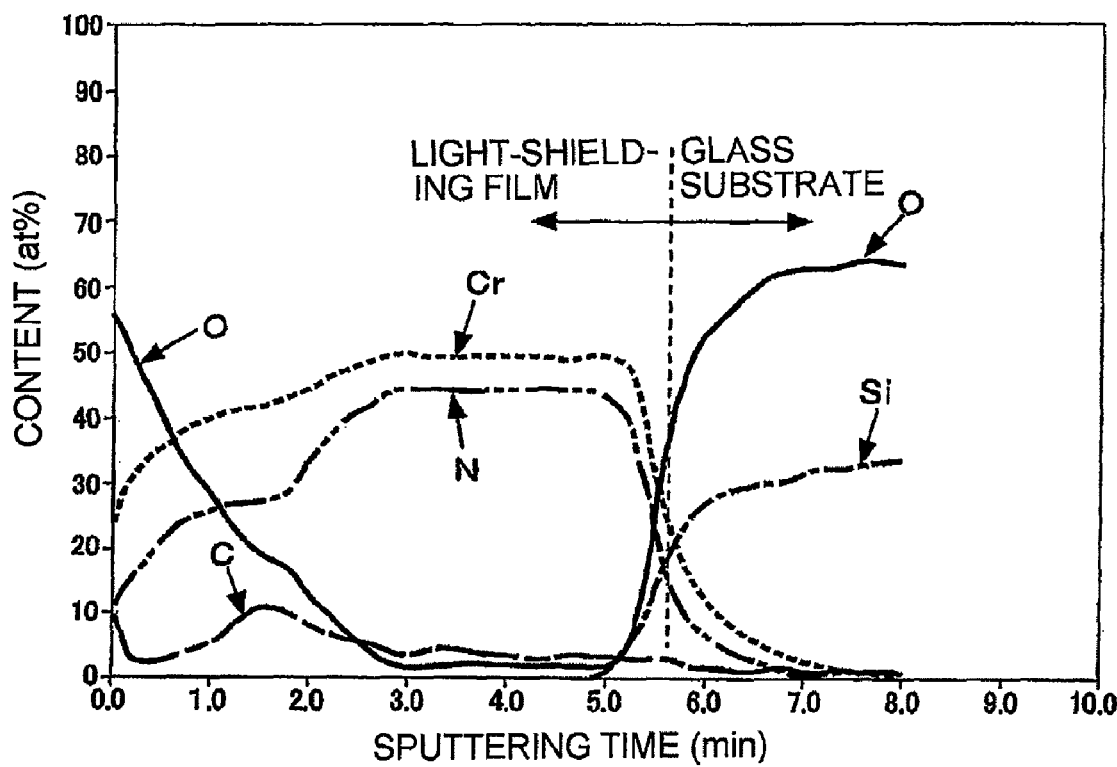
FIG. 5 is a graph showing the results of Auger spectroscopy analysis of a light-shielding film in Example 1.

FIG. 5 is a graph showing the results of Auger spectroscopy analysis of a light-shielding film according to this Example. In the results, the light-shielding layer of the light-shielding film was a compositionally gradient film containing chromium and nitrogen and slightly containing oxygen and carbon that were used for forming a reflection-preventing layer. The reflection-preventing layer was a compositionally gradient film containing chromium, nitrogen, and oxygen and slightly containing carbon. FIG. 5 shows the analysis results of the light-shielding film formed directly on a glass substrate in this Example.

The ratio of a thickness of the reflection-preventing layer to the total thickness of the light-shielding film in this Example was 0.38. In addition, this light-shielding film had an optical density of 3.0 in the lamination structure with a half-tone phase-shifter film. Furthermore, the reflectance of this light-shielding film at an exposure wavelength of 193 nm could be controlled to be low, such as 14.8%. In addition, the reflectances to wavelengths of 257 nm and 364 nm, which were the defect inspection wavelengths of a photomask, were 19.9% and 19.7%, respectively. These were not problems for the inspection.

Then, the photomask blank 30 was baked at 160° C. in consideration of the type of a resist for improving adhesion of a resist film that is formed on the light-shielding film. The flatness of the substrate at the point when the baking was conducted was 0.33 μm, and the main surface of the substrate was a convex shape. Thus, a good flatness that was approximately the same as that of the substrate at the initial state was obtained. Then, an electron beam resist film (CAR-FEP171, FUJIFILM Electronics Materials), which is a chemically amplified resist, was formed on the photomask blank 30. This resist film was formed by a spin-coating method using a spinner (spin-coating apparatus). After the application of the resist film, prebake treatment was conducted. The flatness of the substrate at this point was 0.33 μm at 130° C., and the main surface of the substrate was a convex shape. Thus, there were no changes therein.

Figure 8:
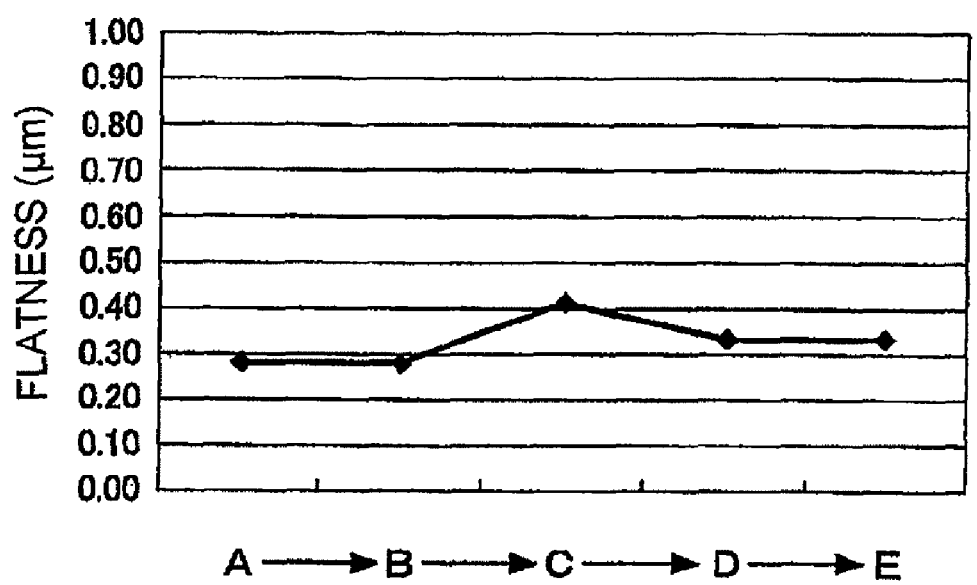
FIG. 8 is a graph showing a change in the flatness of the substrate in a photomask blank-producing process.

FIG. 8 shows a change in the flatness of the substrate in the above-described photomask blank-producing process. Reference character A shows the glass substrate at the initial state, reference character B shows that after the formation of the phase-shifter film, reference character C shows that after the formation of light-shielding film, reference character D shows that after the baking treatment but before the formation of the resist film, and reference character E shows that after the prebake treatment.

Then, the resist film formed on the photomask blank 30 was subjected to a desired pattern drawing using an electron beam drawing apparatus. The aforementioned resist material used had photosensitivity to an electron beam or a laser beam. Then, a resist pattern 7 was formed by developing with a predetermined developing solution (refer to FIG. 3($b$)).

Then, the light-shielding film 2 consisting of the light-shielding layer 5 and the reflection-preventing layer 6 were dry etched along the resist pattern 7 to form a light-shielding film pattern 2$a$ (refer to FIG. 3($c$)). The dry etching gas was a gas mixture of $Cl_2$ and $O_2$ ($Cl_2$:$O_2$=4:1). The etching rate was very fast of 3.6 Å/sec as total film thickness of light-shielding film/etching time. The film thickness loss of the resist was 2.1 Å/sec, and the selection ratio of the light-shielding film to the resist was 1.7.

Thus, the light-shielding film 2 was thin, and also the etching rate was high and the etching time was short. Consequently, the cross-sectional shape of the light-shielding film pattern 2$a$ was a vertical form and hence good. In addition, since the flatness of the photomask blank was good, the patterning accuracy of the light-shielding film 2 was also good.

Then, the half-tone phase-shifter film 4 was etched using the light-shielding film pattern 2$a$ and the resist pattern 7 as a mask to form a half-tone phase-shifter film pattern 4$a$ (refer to FIG. 3($d$)). Since the etching of this half-tone phase-shifter film 4 is influenced by the cross-sectional shape of the light-shielding film pattern 2$a$, the cross-sectional shape of the half-tone phase-shifter film pattern 4$a$ was also good due to the good cross-sectional shape of the light-shielding film pattern 2$a$.

Then, the remaining resist pattern 7 was peeled off, and a resist film 8 was applied again. Then, patterning exposure was conducted for removing unnecessary light-shielding film pattern from a transfer region, and a resist pattern 8$a$ was formed by developing the resist film 8 (refer to FIGS. 3($e$) and 3($f$)). Then, unnecessary light-shielding film pattern was removed by wet etching, and the remaining resist pattern was peeled off to give a photomask 40 (refer to FIG. 3($g$)).

In the example shown in FIG. 3($g$), the light-shielding film is formed on the phase-shifter film at a peripheral region which is a region other than the transfer region (mask pattern forming region). This light-shielding film prevents exposure light from passing through this peripheral region. That is, the phase-shift mask is used as a mask of a reduced projection exposure apparatus (stepper), and when pattern transfer is conducted using this reduced projection exposure apparatus, the exposure is conducted by coating the peripheral region with a coating material (aperture) equipped to the exposure apparatus so that only the transfer region of the phase-shift mask is exposed. However, this coating material is difficult to be located with a high accuracy so that only the transfer region is exposed. In many cases, the exposed portion extends to non-transfer region at the circumferential periphery of the transfer region. In general, a light-shielding film is formed at the non-transfer region of a mask for blocking this extended exposure light. In a case of a half-tone phase-shift mask, the phase-shifter film has a light-shielding function. However, this phase-shifter film cannot completely block exposure light and allows exposure light to pass through, though the intensity of the light per one exposure is small substantially not to contribute to the exposure. Therefore, in some cases, a region where patterning exposure has been already conducted is exposed with this extended exposure light passed through this phase-shifter film multiple times in repeated steps or a region where slight exposure has been conducted with extended light in other shots is similarly exposed with this extended exposure light repeatedly. In some cases, defects were caused when the multiple exposures were added to reach an intensity to contribute to the exposure. The aforementioned light-shielding film formed on the phase-sifter film in the peripheral region which is a region other than the mask pattern-forming region can solve this problem. Furthermore, in a case that a sign for discrimination or the like is affixed to the peripheral region of the mask, the light-shielding film can make it easy to recognize affixed sign or the like.

Example 2

A TaHf film having a thickness of 75 Å was formed on the same light-transmitting substrate of synthetic silica glass as that in Example 1 having a main surface finished into a convex shape and having a flatness of 0.29 μm using a cluster-type sputtering apparatus by DC magnetron sputtering using a mixture of argon (Ar) and hafnium (Hf) (Ta:Hf=90:10 at %) as a sputtering target in argon (Ar) atmosphere. Then, an SiON film (Si:O:N=40:27:33 at %) having a thickness of 740 Å was formed by reactive sputtering using an Si target in atmosphere of a gas mixture of argon, oxygen, and nitrogen. That is, a half-tone phase-shifter film for an ArF excimer laser (wavelength: 193 nm) constituted by a lower layer of the TaHf film and an upper layer of the SiON film was formed. Then, heat treatment was conducted at 420° C. This half-tone phase-shifter film had a high transmittance of 15.0% and phase-shift amount of approximately 180° in an ArF excimer laser (wavelength: 193 nm).

Then, a light-shielding layer and a reflection-preventing layer having a total thickness of 48 nm were formed on the half-tone phase-shifter film by completely the same process as in Example 1. The flatness of the substrate after the formation of the light-shielding film was 0.38 μm, and the main surface of the substrate was a convex shape.

A half-tone phase-shift mask was formed using the thus obtained photomask blank for a half-tone phase-shift mask as in Example 1. The flatness of the substrate after the prebake treatment was 0.35 μm, and the main surface of the substrate was a convex shape. Thus, good flatness was obtained. Furthermore, in this Example, as shown in FIG. 4, the light-shielding film was formed at a portion other than the boundary with a light-transmitting portion (portion where a mask pattern is not formed and a light-transmitting substrate is exposed) of the mask pattern, without removing the light-shielding film pattern within the transfer region.

Figure 4:
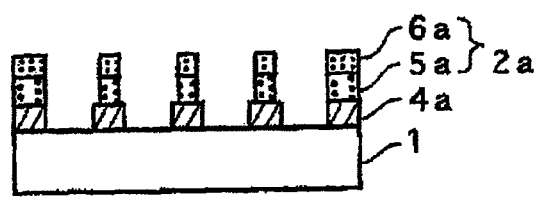
FIG. 4 is a cross-sectional view of a half-tone phase-shift mask prepared by the present invention.

In the half-tone phase-shift mask shown in FIG. 4, a portion that is fundamentally required to be completely shielded from light is more completely shielded from light by forming a light-shielding film at a portion that is in a region where a mask pattern of the phase-shifter film is formed and is other than the boundary with a light-transmitting portion (portion where a mask pattern is not formed and a light-transmitting substrate is exposed) of the mask pattern. That is, in the region where a mask pattern is formed, the phase-shifter film as a mask pattern is fundamentally required to have only a function of transmitting light of which phase is shifted only at the boundary with the light-transmitting portion. In the other most portion (portion other than the boundary), it is desirable that light is completely shielded. In the form of the photomask in this Example, superiority and inferiority of the flatness of the photomask blank highly affect the patterning accuracy and the like, the present invention is particularly preferred.

Example 3

A light-shielding film was formed on the same light-transmitting substrate of synthetic silica glass as that in Example 1 having a main surface finished into a convex shape and having a flatness of 0.29 μm, as in Example 1, to produce a photomask blank for a binary mask. In this Example, the total thickness of the light-shielding film was 68 nm, and the optical density was 3.0. The reflectance of the light-shielding film at an exposure wavelength of 193 nm was suppressed to a low level of 13.5%. In addition, the reflectances to wavelengths of 257 nm and 364 nm, which are the defect inspection wavelengths of a photomask, were 19.9% and 19.7%, respectively. These were not problems for the inspection. The flatness of the substrate after the formation of the light-shielding film was 0.32 μm, and the main surface of the substrate was a convex shape.

Then, a photomask was produced using the obtained photomask blank according to the aforementioned process shown in FIG. 2. First, the photomask blank 10 provided with a light-shielding film was baked at 160° C. Then, an electron beam resist (CAR-FEP171, FUJIFILM Electronics Materials), which is a chemically amplified resist, was spin coated on the photomask blank 10. Then, prebaking was conducted at 130° C. The flatness of the substrate after the prebaking was 0.29 μm, and the main surface of the substrate was a convex shape. Thus, good flatness was obtained.

Then, a resist pattern 3a was formed by subjecting the resist film formed on the photomask blank 30 to a desired pattern drawing using an electron beam drawing apparatus and developing with a predetermined developing solution.

Then, the light-shielding film 2 was dry etched along the resist pattern 3a to form a light-shielding film pattern 2a. The dry etching gas was a gas mixture of $Cl_2$ and $O_2$ ($Cl_2:O_2$=4:1). The etching rate was very fast of 3.6 Å/sec as total film thickness of light-shielding film/etching time. Thus, the light-shielding film 2 was thin, and also the etching rate was high and the etching time was short. Consequently, the cross-sectional shape of the light-shielding film pattern 2a was a vertical form and hence good. In addition, since the flatness of the photomask blank when the light-shielding film was patterned was good, the CD loss (CD error) (a difference between the actual line width and the designed line width) of the formed light-shielding film pattern was small of 20 nm and the patterning accuracy of the light-shielding film pattern 2a was also good.

COMPARATIVE EXAMPLE

A light-shielding layer was formed on the same light-transmitting substrate of synthetic silica glass as that in Example 1 having a main surface finished into a convex shape and having a flatness of 0.29 μm using an in-line type sputtering apparatus by reactive sputtering using a chromium sputtering target in atmosphere of a gas mixture of argon and nitrogen and then in atmosphere of a gas mixture of argon, methane, and helium (Ar: 54 vol %, $CH_4$: 6 vol %, He: 40 vol %). Subsequently, a reflection-preventing layer was formed by reactive sputtering in atmosphere of a gas mixture of argon and nitrogen monoxide (Ar: 90 vol %, NO: 10 vol %). Thus, a light-shielding film having a total thickness of 68 nm and consisting of the light-shielding layer and the reflection-preventing layer was formed.

The ratio of the thickness of the reflection-preventing layer to the total thickness of the light-shielding film of this Comparative Example was 0.15. The optical density of this light-shielding film was 3.0, and the reflectance of the light-shielding film at an exposure wavelength of 193 nm was suppressed to a low level of 13.8%.

In addition, the film stress of the light-shielding film was decreased by introducing a helium gas into the atmosphere when the light-shielding film was formed. As a result, the flatness of the mask blank after the formation of the light-shielding film was 0.08 µm, and the main surface of the substrate was a convex shape.

Then, a photomask was produced using the obtained photomask blank as in Example 3. The flatness of the mask blank after the prebaking was 0.15 µm, and the shape of the main surface of the substrate was deteriorated to be concave. Furthermore, the dry etching rate of the light-shielding film was very slow such as 1.8 Å/sec as total thickness of light-shielding film/etching time. Thus, in the light-shielding film of this Comparative Example, the etching rate was fast and the etching took a long time, and thereby the cross-sectional shape of the light-shielding film pattern was also bad. Furthermore, the resist film was highly damaged. Furthermore, since the flatness of the photomask blank when the light-shielding film was patterned was not good, the CD loss (CD error) (a difference between the actual line width and the designed line width) of the formed light-shielding film pattern was large such as 50 nm, and the patterning accuracy of the light-shielding film pattern 2a was also poor compared to those in Examples.

Example 4

A light-shielding film was formed on a light-transmitting substrate of synthetic silica glass having a flatness of 0.25 µm and having a main surface finished into a concave shape to produce a photomask blank for a binary mask. The light-shielding film was formed as follows:

A light-shielding layer was formed using an in-line type sputtering apparatus by reactive sputtering using a chromium sputtering target in atmosphere of a gas mixture of argon, nitrogen, and helium (Ar: 30 sccm, $N_2$: 30 sccm, He: 80 sccm). During the formation of the light-shielding layer, the power of the sputtering apparatus was 1.5 kW, the total gas pressure was adjusted to 0.17 pascal (Pa). Then, the power of the sputtering apparatus was decreased to 0.33 kW and the total gas pressure was adjusted to 0.28 pascal (Pa), and a reflection-preventing layer was formed by reactive sputtering in atmosphere of a gas mixture of argon, methane, and helium (Ar: 54 sccm, $CH_4$: 6 sccm, He: 40 sccm) and subsequently in atmosphere of a gas mixture of argon and nitrogen monoxide (Ar: 90 sccm, NO: 10 sccm). Thus, a light-shielding film having a total thickness of 68 nm and consisting of the light-shielding layer and the reflection-preventing layer was formed. In addition, a relationship, as shown in FIG. 6, of flatness variation before and after bake treatment of a substrate (glass substrate having the aforementioned light-shielding film thereon) and bake temperature was preliminarily investigated. A relationship, as shown in FIG. 9, of stress of a light-shielding film and a helium flow rate in gas mixture atmosphere for forming a light-shielding film was also preliminarily investigated. Then, from FIG. 6, a change in the film stress of a light-shielding film was anticipated based on the flatness variation in a substrate at the bake temperature (160° C.) before the formation of a resist film on the light-shielding film. The bake temperature is the highest heating temperature applied to the light-shielding film. Then, a helium gas flow rate that causes a desired film stress in the direction opposite to the anticipated change in the film stress was determined from the relationship shown in FIG. 9. Then, the light-shielding film consisting of the light-shielding layer and the reflection-preventing layer was formed by sputtering in atmosphere containing the above-determined helium gas flow rate. The flatness of the substrate at the point when the light-shielding film was formed was 0.25 µm, and the main surface of the substrate was a convex shape.

Then, the photomask blank 30 was baked at 160° C. in consideration of the type of a resist for improving adhesion of a resist film that is formed on the light-shielding film. The flatness of the substrate at the point when the baking was conducted was 0.2 µm, and the main surface of the substrate was a convex shape.

Then, a photomask was produced using the obtained photomask blank according to the above-described process shown in FIG. 2. First, the photomask blank 10 provided with the light-shielding film was baked at 160° C. Then, an electron beam resist (CAR-FEP171, FUJIFILM Electronics Materials), which is a chemically amplified resist, was formed on the photomask blank 10. This resist film was formed by spin-coating using a spinner (spin-coating apparatus). After the application of the resist film, prebake treatment was conducted at 130° C. The flatness of the substrate at this point was 0.2 µm, and the main surface of the substrate was a convex shape. Thus, there were no changes therein.

Then, a resist pattern 3a was formed by subjecting the resist film formed on the photomask blank 10 to a desired pattern drawing using an electron beam drawing apparatus and developing with a predetermined developing solution.

Then, the light-shielding film 2 was dry etched along the resist pattern 3a to form a light-shielding film pattern 2a. The dry etching gas was a gas mixture of $Cl_2$ and $O_2$ ($Cl_2:O_2=4:1$). The etching rate was very fast of 4.0 Å/sec as total film thickness of light-shielding film/etching time. Thus, the light-shielding film 2 had a thin film thickness, and also the etching rate was high and the etching time was short. Consequently, the cross-sectional shape of the light-shielding film pattern 2a was a vertical form and hence good. In addition, since the flatness of the photomask blank when the light-shielding film was patterned was good, the CD loss (CD error) (a difference between the actual line width and the designed line width) of the formed light-shielding film pattern was small of 20 nm and the patterning accuracy of the light-shielding film pattern 2a was also good.

Method of Producing a Semiconductor Device

Photomasks prepared in Examples 1 to 4 were each placed in an exposure apparatus, and the pattern was transferred to a resist film of a semiconductor device to produce a semiconductor device. The circuit pattern formed on the semiconductor substrate did not have defects, and a good semiconductor device was obtained.

The invention claimed is:
1. A method of producing a photomask blank comprising:
forming a light-shielding film containing chromium and nitrogen on a light-transmitting substrate by sputtering using a target composed of chromium in atmosphere containing nitrogen, and carrying out, after the formation of the light-shielding film, a plurality of heat treatments in which heat is applied to the light-shielding film; the method further comprising:

anticipating a change in a film stress that is caused in the light-shielding film by the heat treatment at a highest temperature applied to the light-shielding film in the plurality of heat treatments; and adjusting, in consideration of an anticipated change in the film stress, the nitrogen content contained in the light-shielding film so as to cancel the change in the film stress that is caused in the light-shielding film by the heat treatment at the highest temperature applied to the light-shielding film.

2. A method of producing a photomask blank comprising:

forming a light-shielding film containing chromium and nitrogen on a light-transmitting substrate by sputtering using a target composed of chromium in atmosphere containing nitrogen, and carrying out, after the formation of the light-shielding film, a plurality of heat treatments in which heat is applied to the light-shielding film; the method further comprising:

anticipating a change in a film stress that is caused in the light-shielding film by the heat treatment at a highest temperature applied to the light-shielding film in the plurality of heat treatments; and adjusting, in consideration of an anticipated change in the film stress, the nitrogen content contained in the light-shielding film so that the light-shielding film has a desired film stress in the direction opposite to that of the anticipated change in the film stress that is caused in the light-shielding film by the heat treatment at the highest temperature applied to the light-shielding film after the formation of the light-shielding film and that the flatness of the photomask blank obtained by the change in the film stress becomes a predetermined level or less.

3. The method of producing a photomask blank according to claim 1 or 2, wherein the plurality of heat treatments include one of heat treatments performed before the formation of a resist film or after the formation of a resist film on the light-shielding film.

4. The method of producing a photomask blank according to claim 1 or 2, wherein a difference in flatness between that of the substrate before the formation of the light-shielding film and that of the substrate after the formation of the light-shielding film and then heat treated is 0.10 µm or less.

5. The method of producing a photomask blank according to claim 1 or 2, wherein the nitrogen content is adjusted so that the light-shielding film has a compression stress.

6. The method of producing a photomask blank according to claim 1 or 2, wherein a half-tone phase-shifter film is formed between the light-transmitting substrate and the light-shielding film.

7. The method of producing a photomask blank according to claim 6, wherein the half-tone phase-shifter film has a transmittance of 10% or more and 40% or less at an exposure wavelength.

8. The method of producing a photomask blank according to claim 6, wherein the light-shielding film has a thickness so that an optical density of 2.5 or more is achieved in a combination with the half-tone phase-shifter film.

9. The method of producing a photomask blank according to claim 1 or 2, wherein the photomask blank is one for dry etching being provided for a method of producing a photomask by patterning the light-shielding film by dry etching using a resist pattern formed on the light-shielding film as a mask.

10. A method of producing a photomask comprising a process of patterning the light-shielding film of a photomask blank obtained by the method according to claim 1 or 2 by dry etching.

11. A method of producing a photomask wherein the light-shielding film of a photomask blank obtained by the method according to claim 6 is patterned by dry etching to form a light-shielding film pattern on the half-tone phase-shifter film, and then the half-tone phase-shifter film is patterned by dry etching using the light-shielding film pattern as a mask to form a half-tone phase-shifter film pattern on the light-transmitting substrate.

12. A method of producing a photomask blank comprising:

forming a light-shielding film containing chromium and nitrogen on a light-transmitting substrate by sputtering using a target of chromium or having a main component of chromium in atmosphere containing a helium gas and at least one of a nitrogen gas and a nitrogen compound gas, and carrying out, after the formation of the light-shielding film, a plurality of heat treatments in which heat is applied to the light-shielding film; the method further comprising:

anticipating a change in a film stress that is caused in the light-shielding film by the heat treatment at a highest temperature applied to the light-shielding film in the plurality of heat treatments; and adjusting, in consideration of an anticipated change in the film stress, the flow rate of at least one of the nitrogen gas, the nitrogen compound gas, and the helium gas contained in the sputtering atmosphere so that the light-shielding film has a desired film stress in the direction opposite to that of the anticipated change in the film stress that is caused in the light-shielding film by the heat treatment at the highest temperature applied to the light-shielding film after the formation of the light-shielding film and that the flatness of the photomask blank obtained by the change in the film stress becomes a predetermined level or less.

13. The method of producing a photomask blank according to claim 12, wherein the plurality of heat treatments includes one of heat treatments performed before the formation of a resist film or after the formation of a resist film on the light-shielding film.

14. The method of producing a photomask blank according to claim 12, wherein the gas flow rate of at least one of the nitrogen gas, the nitrogen compound gas, and the helium gas is adjusted so that the light-shielding film has a compression stress.

15. The method of producing a photomask blank according to claim 12, wherein the gas flow rate of at least one of the nitrogen gas, the nitrogen compound gas, and the helium gas is adjusted so that the selection ratio of the light-shielding film to a resist formed on the light-shielding film exceeds 1.

16. The method of producing a photomask blank according to claim 12, wherein a half-tone phase-shifter film is formed between the light-transmitting substrate and the light-shielding film.

17. The method of producing a photomask blank according to claim 16, wherein the half-tone phase-shifter film has a transmittance of 10% or more and 40% or less to at an exposure wavelength.

18. The method of producing a photomask blank according to claim 16, wherein the light-shielding film has a thickness so that an optical density of 2.5 or more is achieved in a combination with the half-tone phase-shifter film.

19. The method of producing a photomask blank according to claim 12, wherein the photomask blank is one for dry etching being provided for a method of producing a photomask by patterning the light-shielding film by dry etching using a resist pattern formed on the light-shielding film as a mask.

20. A method of producing a photomask comprising a process of patterning the light-shielding film of a photomask blank obtained by the method according to claim 12 by dry etching.

21. A method of producing a photomask wherein the light-shielding film of a photomask blank obtained by the method according to claim 16 is patterned by dry etching to form a light-shielding film pattern on the half-tone phase-shifter film, and then the half-tone phase-shifter film is patterned by dry etching using the light-shielding film pattern as a mask to form a half-tone phase-shifter film pattern on the light-transmitting substrate.

22. A method of producing a semiconductor device, wherein a pattern is transferred onto a semiconductor substrate by photolithography using the light-shielding film pattern or the half-tone phase-shifter film pattern of the photomask according to claim 10.

23. A method of producing a semiconductor device, wherein a pattern is transferred onto a semiconductor substrate by photolithography using the light-shielding film pattern or the half-tone phase-shifter film pattern of the photomask according to claim 11.

24. A method of producing a semiconductor device, wherein a pattern is transferred onto a semiconductor substrate by photolithography using the light-shielding film pattern or the half-tone phase-shifter film pattern of the photomask according to claim 20.

25. A method of producing a semiconductor device, wherein a pattern is transferred onto a semiconductor substrate by photolithography using the light-shielding film pattern or the half-tone phase-shifter film pattern of the photomask according to claim 21.

* * * * *